United States Patent
Nago et al.

(10) Patent No.: US 8,623,683 B2
(45) Date of Patent: Jan. 7, 2014

(54) METHOD OF FABRICATING A NITRIDE SEMICONDUCTOR LIGHT EMITTING DEVICE

(71) Applicant: Kabushiki Kaisha Toshiba, Tokyo (JP)

(72) Inventors: Hajime Nago, Kanagawa-ken (JP); Koichi Tachibana, Kanagawa-ken (JP); Toshiyuki Oka, Kanagawa-ken (JP); Shigeya Kimura, Tokyo (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/737,986

(22) Filed: Jan. 10, 2013

(65) Prior Publication Data

US 2013/0122626 A1 May 16, 2013

Related U.S. Application Data

(60) Division of application No. 13/221,456, filed on Aug. 30, 2011, now Pat. No. 8,455,917, which is a continuation of application No. PCT/JP2009/007049, filed on Dec. 21, 2009.

(51) Int. Cl.
*H01L 21/00* (2006.01)
*H01L 29/66* (2006.01)

(52) U.S. Cl.
USPC ............. 438/45; 438/514; 257/102; 257/103; 257/190; 257/E33.022; 257/E33.029; 257/E21.155

(58) Field of Classification Search
None
See application file for complete search history.

(56) References Cited

U.S. PATENT DOCUMENTS

| 6,172,382 | B1 | 1/2001 | Nagahama et al. |
| 6,242,761 | B1 | 6/2001 | Fujimoto et al. |
| 7,230,263 | B2 | 6/2007 | Kawagoe |
| 7,496,124 | B2 | 2/2009 | Kozaki et al. |
| 8,076,679 | B2 | 12/2011 | Kinoshita et al. |

(Continued)

FOREIGN PATENT DOCUMENTS

| JP | 2000-349398 | 12/2000 |
| JP | 3446660 | 7/2003 |

(Continued)

OTHER PUBLICATIONS

Notification of Reasons for Refusal issued by the Japanese Patent Office on Nov. 10, 2011, for Japanese Patent Application No. 2011-540650, and English-language translation thereof.

(Continued)

*Primary Examiner* — Alonzo Chambliss
(74) *Attorney, Agent, or Firm* — Finnegan, Henderson, Farabow, Garrett & Dunner, L.L.P.

(57) ABSTRACT

According to one embodiment, in a nitride semiconductor light emitting device, a first clad layer includes an n-type nitride semiconductor. An active layer is formed on the first clad layer, and includes an In-containing nitride semiconductor. A GaN layer is formed on the active layer. A first AlGaN layer is formed on the GaN layer, and has a first Al composition ratio. A p-type second AlGaN layer is formed on the first AlGaN layer, has a second Al composition ratio higher than the first Al composition ratio, and contains a larger amount of Mg than the GaN layer and the first AlGaN layer. A second clad layer is formed on the second AlGaN layer, and includes a p-type nitride semiconductor.

7 Claims, 9 Drawing Sheets

$0 < x1 \leq 0.01$, $x1 < x2$
$Mg0, Mg1 \leq 1E18 cm^{-3}$, $Mg0, Mg1 < Mg2$

(56) References Cited

U.S. PATENT DOCUMENTS

| | | |
|---|---|---|
| 8,227,268 B2 | 7/2012 | Emerson et al. |
| 8,455,917 B2 * | 6/2013 | Nago et al. .................... 257/102 |
| 2002/0179923 A1 | 12/2002 | Morita et al. |
| 2005/0269584 A1 | 12/2005 | Hasegawa et al. |
| 2010/0025657 A1 | 2/2010 | Nagahama et al. |
| 2010/0090244 A1 | 4/2010 | Ohba |
| 2010/0244079 A1 | 9/2010 | Orita |
| 2010/0309943 A1 | 12/2010 | Chakraborty et al. |
| 2010/0317136 A1 | 12/2010 | Yanashima et al. |
| 2011/0168977 A1 | 7/2011 | Eichler et al. |
| 2012/0049328 A1 | 3/2012 | Tsuda et al. |

FOREIGN PATENT DOCUMENTS

| | | |
|---|---|---|
| JP | 2003-283057 | 10/2003 |
| JP | 2004-104089 | 4/2004 |
| JP | 2004-356256 | 12/2004 |
| JP | 2005-353690 | 11/2005 |
| JP | 2006-261392 | 9/2006 |
| JP | 2007-59941 | 3/2007 |
| JP | 2007-207827 | 8/2007 |
| JP | 2009-16467 | 1/2009 |
| JP | 2009-38408 | 2/2009 |
| JP | 2009-218235 | 9/2009 |

OTHER PUBLICATIONS

Notification of Reasons for Refusal issued by the Japanese Patent Office on Mar. 16, 2012, for Japanese Patent Application No. 2011-540650, and English-language translation thereof.

Notice of Preliminary Rejection issued by the Korean Intellectual Property Office on Apr. 26, 2013, for Korean Patent Application No. 10-2012-7015478, and English-language translation thereof.

Notice of Reasons for Refusal issued by the Japanese Patent Office on Oct. 8, 2013, for Japanese Patent Application No. 2012-111397, and English-language translation thereof.

* cited by examiner $0 < x1 \leqq 0.01$, $x1 < x2$
$Mg0$, $Mg1 \leqq 1E18 cm^{-3}$, $Mg0$, $Mg1 < Mg2$

METHOD OF FABRICATING A NITRIDE SEMICONDUCTOR LIGHT EMITTING DEVICE

CROSS REFERENCE TO RELATED APPLICATION

This is a division of application Ser. No. 13/221,456, filed Aug. 30, 2011, which is incorporated herein by reference.

FIELD

Embodiments described herein relate generally to a nitride semiconductor light emitting device and a method for manufacturing the nitride semiconductor light emitting device.

BACKGROUND

There are conventionally-known nitride semiconductor light emitting devices in each of which a p-type Mg-doped AlGaN layer as an electron barrier layer to trap electrons in an active layer is formed on an active layer including an In-containing nitride semiconductor (see the description of Japanese Patent No. 3446660 and Japanese Patent Application Publication No. 2006-261392, for example).

In the nitride semiconductor light emitting device disclosed in the description of Japanese Patent No. 3446660, the p-type AlGaN layer includes a first p-type AlGaN layer and a second p-type AlGaN layer. The first p-type AlGaN layer is formed by MOCVD (Metal Organic Chemical Vapor Deposition) which uses a N2 gas to inhibit the deterioration of the active layer. The second p-type AlGaN layer is formed by MOCVD which uses a H2 gas to form barrier potential.

In the nitride semiconductor light emitting device, however, the Al composition ratio of the first p-type AlGaN layer is almost the same as that of the second p-type AlGaN layer, and is set at 0.1 or greater. In addition, the first p-type AlGaN layer is doped with a large amount of Mg for decreasing the bulk resistance.

As a result, the nitride semiconductor light emitting device entails a problem that the quality of the active layer is deteriorated due to excessive diffusion of Mg into the active layer in the process of forming the second p-type AlGaN layer.

The nitride semiconductor light emitting device disclosed in Japanese Patent Application Publication No. 2006-261392 has an intermediate layer between the active layer and the p-type AlGaN layer for the purpose of inhibiting excessive diffusion of Mg into the active layer. The intermediate layer includes an undoped GaN layer, an undoped AlGaN layer and the like.

In the case of the nitride semiconductor light emitting device, however, the temperature of the substrate is raised while the intermediate layer is being grown on the active layer. As a result, the nitride semiconductor light emitting device has a problem that the active layer thermally deteriorates during the temperature rise, and accordingly entails the quality degradation.

In short, the nitride semiconductor light emitting devices have problems such as the decrease in the light-emission efficiency and the incapability of producing sufficient light output.

DETAILED DESCRIPTION

Figure 1:
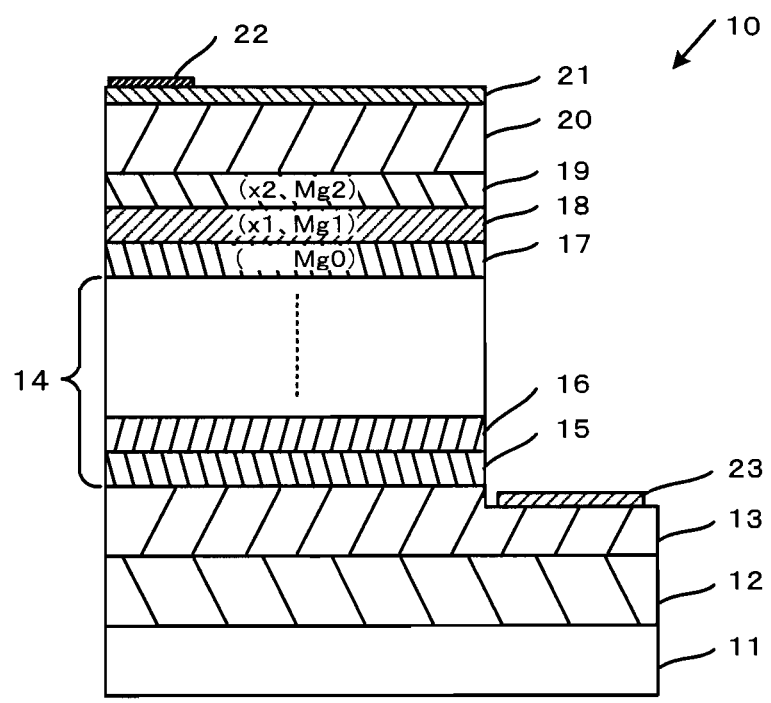
FIG. 1 is a cross-sectional view showing the nitride semiconductor light emitting device according to an embodiment.

According to one embodiment, in a nitride semiconductor light emitting device, a first clad layer includes an n-type nitride semiconductor. An active layer is formed on the first clad layer, and includes an In-containing nitride semiconductor. A GaN layer is formed on the active layer. A first AlGaN layer is formed on the GaN layer, and has a first Al composition ratio. A p-type second AlGaN layer is formed on the first AlGaN layer, has a second Al composition ratio higher than the first Al composition ratio, and contains a larger amount of Mg than the GaN layer and the first AlGaN layer. A second clad layer is formed on the second AlGaN layer, and includes a p-type nitride semiconductor.

According to another embodiment, in a method for manufacturing a nitride light emitting device, an active layer including an In-containing nitride semiconductor is formed on a first clad layer including an n-type nitride semiconductor. A GaN layer and a first AlGaN layer having a first Al composition ratio are formed on the active layer in order by metal organic chemical vapor deposition at a first growth temperature in a nitrogen gas atmosphere without doping with Mg. A second AlGaN layer is formed on the first AlGaN layer by metal organic chemical vapor deposition at a second growth temperature, in an atmosphere mainly containing a hydrogen gas with doping with Mg. The second AlGaN layer has a second Al composition ratio larger than the first Al composition ratio. The second growth temperature is higher than the first growth temperature. A second clad layer including a p-type nitride semiconductor is formed on the second AlGaN layer.

Hereinafter, embodiments will be described with reference to the drawings. In the drawings, same reference characters denote the same or similar portions.

[Embodiment]

A nitride semiconductor light emitting device of an embodiment will be described with reference to FIG. 1. FIG. 1 is a cross-sectional view showing the nitride semiconductor light emitting device.

In a nitride semiconductor light emitting device 10 of the embodiment, as shown in FIG. 1, a gallium nitride layer 12 (hereinafter referred to as a "GaN layer" 12) with a thickness of approximately 3 μm is formed on a substrate 11 transparent to light-emission wavelengths, for example, on a sapphire substrate with a buffer layer (not illustrated) interposed in between.

An n-type gallium nitride clad layer 13 (hereinafter referred to as an "n-type GaN clad layer" 13 or a "first clad layer" 13) with a thickness of approximately 2 μm, which is doped with silicon (Si), is formed on the GaN layer 12.

An active layer 14 including an In-containing nitride semiconductor is formed on the n-type GaN clad layer 13. The active layer 14 is a multi-quantum well (MQW) active layer including 5-nanometer-thick gallium nitride barrier layers 15 (each hereinafter referred to as a "GaN barrier layer" 15) and 2.5-nanometer-thick indium gallium nitride well layers 16 (each hereinafter referred to as an "InGaN well layer" 16), which are alternately stacked one on another, with the InGaN well layer 16 placed atop, for example. The active layer 14 will be hereinafter referred to as an "MQW active layer" 14.

A composition ratio x of In to InGaN in each InGaN well layer 16 (the $In_xGa_{1-x}N$ layer, $0<x<1$) is set at approximately 0.1 for the purpose of making a peak light-emission wavelength equal to approximately 450 nm, for example.

A gallium nitride layer 17 (hereinafter referred to as a "GaN layer" 17) is formed on the MQW active layer 14. A first AlGaN layer 18, in which a composition ratio x1 of Al to AlGaN (hereinafter referred to as a "first Al composition ratio") is small, is formed on the GaN layer 17. The composition of the first AlGaN layer is expressed with $Al_{x1}Ga_{1-x1}N$ ($0<x<1$).

The GaN layer 17 and the first AlGaN layer 18 are formed without doping, as described later. Accordingly, the GaN layer 17 and the first AlGaN layer 18 function as cap layers to inhibit the thermal deterioration of the MQW active layer 14 and the diffusion of Mg into the MQW active layer 14 during a temperature rising step.

Hereinafter, the GaN layer 17 will be referred to as a GaN cap layer 17, and the first AlGaN layer 18 will be referred to as an AlGaN cap layer 18.

With this taken into consideration, the AlGaN cap layer 18 needs a combination of the Al composition ratio x1 and the thickness which satisfies the following two requirements: a requirement that the AlGaN cap layer 18 should effectively inhibit the thermal deterioration of the MQW active layer 14 in order that the light emission efficiency should not be impaired, and a requirement that the AlGaN cap layer 18 should be able to obtain a lower bulk resistance in order that the operation voltage should not be disturbed.

The GaN cap layer 17 needs the thickness which satisfies the following two requirements: a requirement that the GaN cap layer 17 should absorb Mg which diffuses into the GaN cap layer 17, and a requirement that the function of a p-type AlGaN layer serving as an electron barrier layer to trap electrons in the MQW active layer 14, which will be described later, should not be impaired.

In this respect, the thickness of the GaN cap layer 17 is set at approximately 5 nm, for example. It is desirable that the Al composition ratio x1 of the AlGaN cap layer 18 should be greater than zero but not greater than 0.01. The Al composition ratio x1 of the AlGaN cap layer 18 is set at 0.003, for example. The thickness of the AlGaN cap layer 18 is set at 1 nm, for example.

A p-type AlGaN electron barrier layer 19 (hereinafter referred to as a "second AlGaN layer" 19 from time to time) to trap electrons in the MQW active layer 14 is formed on the AlGaN cap layer 18. The second AlGaN layer 19 is doped with Mg in a high concentration. The composition of the second AlGaN layer is expressed with $Al_{x2}Ga_{1-x2}N$ ($0<x2<1$ and $x1<x2$).

A composition ratio x2 of Al to $Al_{x2}Ga_{1-x2}N$ in the p-type AlGaN electron barrier layer 19 (hereinafter referred to as a "second Al composition ratio) is larger than the Al composition ratio x1, and is set at 0.1 to 0.2, for example.

The concentration of Mg in the p-type AlGaN electron barrier layer 19 is set at approximately 1E19 to 1E20 $cm^{-3}$, for example. The thickness of the p-type AlGaN electron barrier layer 19 is approximately 10 nm, for example.

A p-type gallium nitride clad layer 20 (hereinafter referred to as a "p-type GaN clad layer" 20 or a "second clad layer" 20) is formed on the p-type AlGaN electron barrier layer 19. The p-type GaN clad layer 20 is approximately 100 nm in thickness, and is doped with Mg in a high concentration, for example. The concentration of Mg in the p-type GaN clad layer 20 is set at approximately 1E19 to 1E20 $cm^{-3}$, for example.

A p-type gallium nitride contact layer 21 (hereinafter referred to as a "p-type GaN contact layer" 21) is formed on the p-type GaN clad layer 20. The p-type GaN contact layer 21 is approximately 10 nm in thickness, and is doped with Mg in a concentration which is higher than the concentration of Mg in the p-type GaN clad layer 20, for example. The concentration of Mg in the p-type GaN contact layer 21 is set at approximately 1E20 to 1E21 $cm^{-3}$, for example.

A p-side electrode 22 made of Ni/Au is formed on the p-type GaN contact layer 21. In addition, one lateral portion of the nitride semiconductor light emitting device 10 is dug in from the p-type GaN contact layer 21 to a portion of the n-type GaN clad layer 13, and an n-side electrode 23 made of Ti/Pt/Au is formed on an exposed portion of the n-type GaN clad layer 13. The n-type GaN clad layer 13 functions as an n-type GaN contact layer at the same time.

Light is emitted from the MQW active layer 14 when an electric current is caused to pass between the p-side electrode 22 and the n-side electrode 23 with the p-side electrode 22 and the n-side electrode 23 connected to the respective positive and negative electrodes of a power supply.

In this respect, the functions respectively of the n-type GaN clad layer 13, the MQW active layer 14, the p-type GaN clad layer 20 and the p-type GaN contact layer 21 are well known. For this reason, descriptions for these layers are omitted.

The thus-structured nitride semiconductor light emitting device is configured in a way that, during the formation of the p-type AlGaN electron barrier layer 19 to the p-type GaN contact layer 21 which are doped with Mg in the high concentration, the effect of inhibiting the thermal deterioration of the MQW active layer 14 and the effect of preventing the diffusion of Mg into the MQW active layer 14 are enhanced by optimizing the two-layered structure including: the GaN cap layer 17 for which the thick film having a better crystallinity can be formed even at a relatively low growth temperature; and the AlGaN cap layer 18 which is capable of effectively inhibiting the thermal deterioration of the MQW active layer 14 because of the chemical stability exhibited at a relative high melting point.

For the purpose of checking this, an examination was made on the depth profile of Mg in the nitride semiconductor light emitting device 10. The result of the examination will be explained with reference to FIG. 2.

The other examination was further made on the influence of the GaN cap layer 17, the AlGaN cap layer 18 and the Al composition ratio x1 on the light emission efficiency. The result of the examination will be explained with reference to FIGS. 3 to 7.

Figure 2:
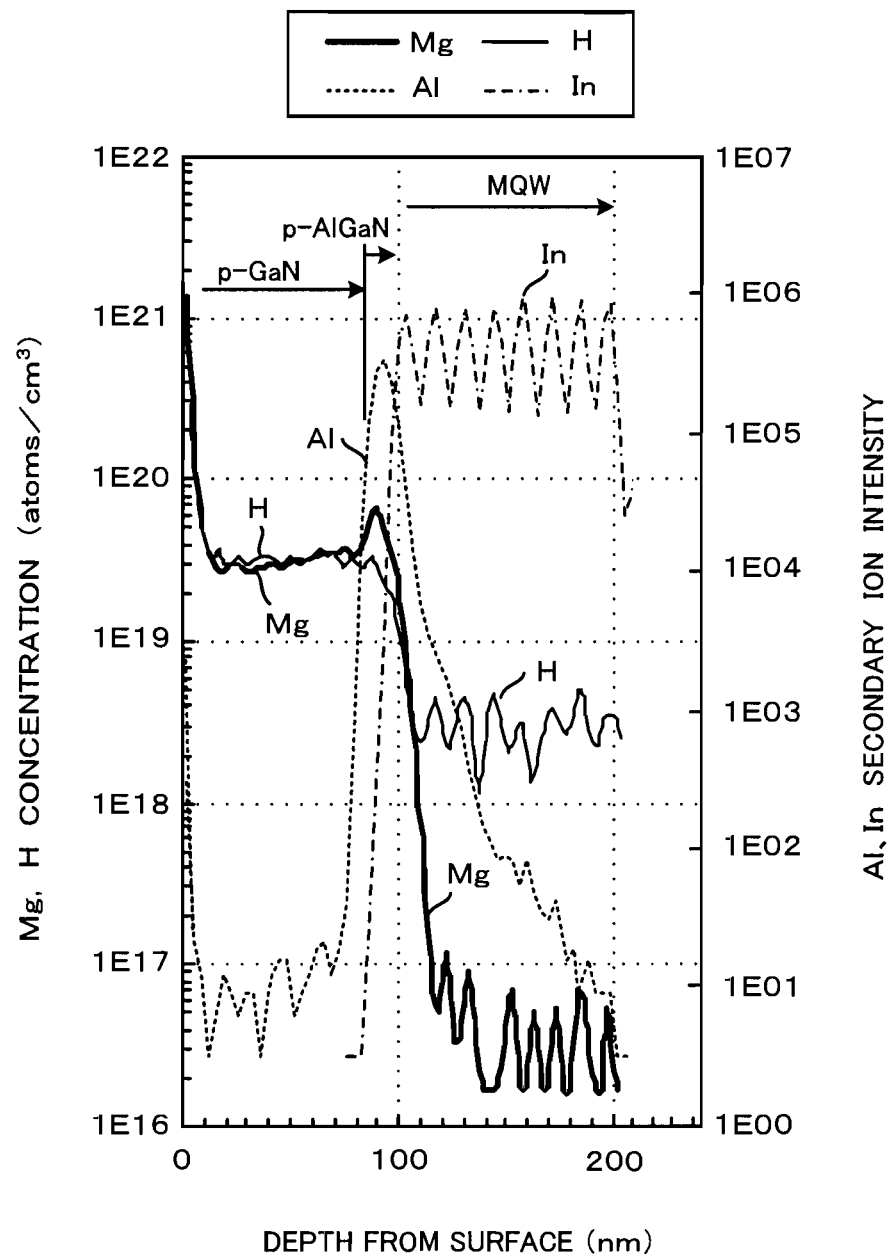
FIG. 2 is a diagram showing the depth profile of Mg in the nitride semiconductor light emitting device.

FIG. 2 is a diagram showing the depth profile of Mg in the nitride semiconductor light emitting device 10. The depth profile of Mg was obtained by use of the SIMS (Secondary Ion Mass Spectrometry).

In addition to the depth profile of Mg, FIG. 2 shows: the depth profile of hydrogen (H), which exhibited the same behavior as did Mg because H was taken in through the bonding of H with Mg during the film formation; and the secondary ionic strengths respectively of Al and In which were used as markers to identify the layers.

A thick continuous line indicates the depth profile of Mg, and a thin continuous line indicates the depth profile of H. In addition, a dashed line indicates the secondary ionic strength of Al, and a chain line indicates the secondary ionic strength of In.

It was learned from the secondary ionic strength respectively of Al and In as well as the depth profiles that, as shown in FIG. 2, the depth of the interface between the MQW active layer 14 and the undoped GaN cap layer 17 was approximately 100 nm from the surface (the design value was 126 nm, for example).

No significant diffusion of Mg into the MQW active layer 14 was observed, because the gradients (approximately 7 nm/decade) of the rises of the secondary ionic strengths of Al and In were almost the same as the gradient of the fall of the concentration of Mg which was not higher than the background level (approximately $5E18\ cm^{-3}$) of the concentration of H. This tells that Mg in the MQW active layer 14 was well below the detection limit.

In addition, the concentration of Mg in each of the undoped GaN cap layer 17 and the undoped AlGaN cap layer 18 was estimated at $1E18\ cm^{-3}$ or less.

As a result, it was confirmed that the diffusion of Mg into the MQW active layer 14 was effectively inhibited by the two-layered structure including: the undoped thick GaN cap layer 17; and the undoped thin AlGaN cap layer 18 in which the Al composition ratio x1 was low.

Figure 3:
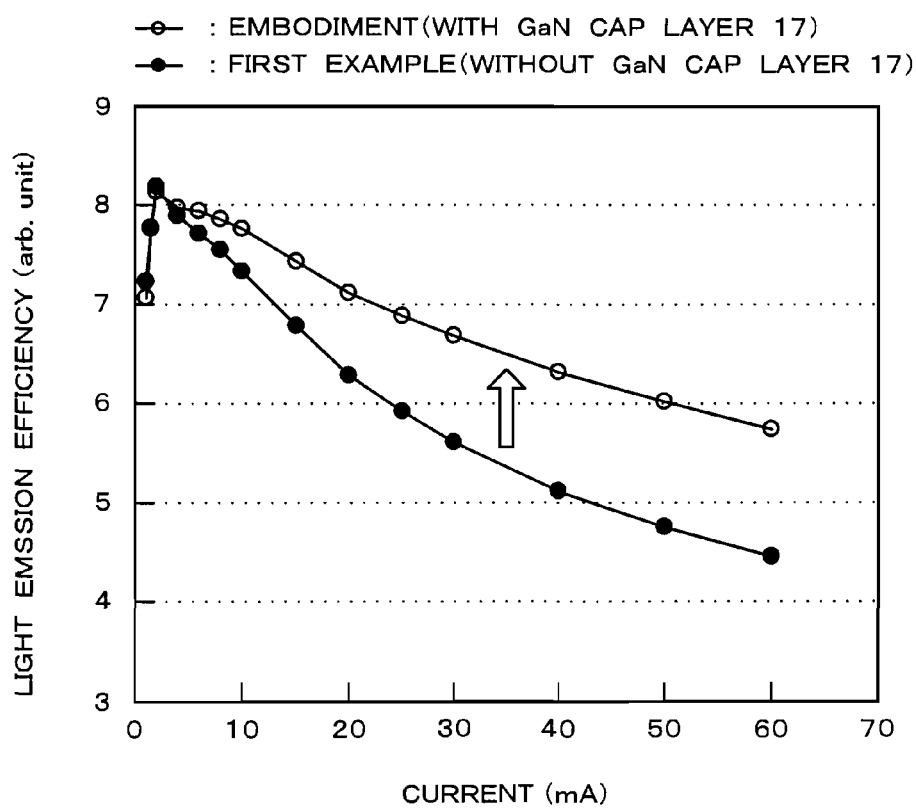
FIG. 3 is a diagram showing the light emission efficiency of the nitride semiconductor light emitting device in comparison with a light emission efficiency of a first comparative example.
Figure 4:
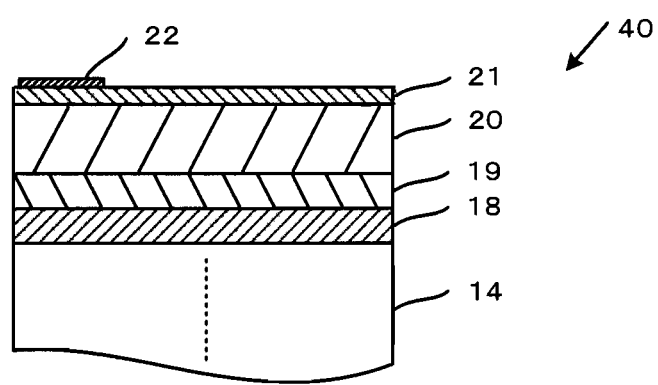
FIG. 4 is a cross-sectional view showing the first comparative example.

FIG. 3 is a diagram showing a dependency of the light emission efficiency of the nitride semiconductor light emitting device 10 on an electric current in comparison with a dependency of the light emission efficiency of a first comparative example on an electric current. FIG. 4 is a cross-sectional view of the first comparative example.

The dependency of the light emission efficiency of each nitride semiconductor light emitting device was obtained by measuring the intensity of light emitted from the nitride semiconductor light emitting device by use of an integrating sphere while changing the electric current to be supplied to the nitride semiconductor light emitting device; and dividing the intensity of the light by the supplied electric current.

In general, the dependency of the light emission efficiency of any nitride semiconductor light emitting device tends to decrease as the electric current increases, except for a low range of the electric current at and immediately after the time of the rise. This stems from something such as: the decrease in the efficiency of the carrier injection which occurs because the probability of injected carriers overflowing from the MQW active layer 14 becomes larger as the electric current increases; and the decrease in the internal quantum efficiency of the MQW active layer which occurs due to the heat generation.

In this respect, the first comparative example was a nitride semiconductor light emitting device 40 which, as shown in FIG. 4, did not include the undoped thick GaN cap layer 17. To begin with, the first comparative example is explained. As shown in FIG. 3, the nitride semiconductor light emitting device 40 of the first comparative example exhibited almost the same light emission efficiency as did the nitride semiconductor light emitting device 10 of the embodiment, while the electric current was 5 mA or less. However, the light emission efficiency of the nitride semiconductor light emitting device 40 of the first comparative example decreased rapidly as the electric current increased.

On the other hand, the light emission efficiency of the nitride semiconductor light emitting device 10 of the embodiment decreased slowly as the electric current increased. In addition, higher light emission efficiency was obtained from the nitride semiconductor light emitting device 10 of the embodiment than from the nitride semiconductor light emitting device 40 of the first comparative example.

The rate of the increase in the light emission efficiency was approximately 9% when the electric current was 20 mA, and approximately 17% when the electric current was 50 mA. The rate of the increase tended to increase as the electric current increased.

This suggests that particularly the undoped thick GaN cap layer 17 inhibited the diffusion of Mg into the MQW active layer 14.

Figure 5:
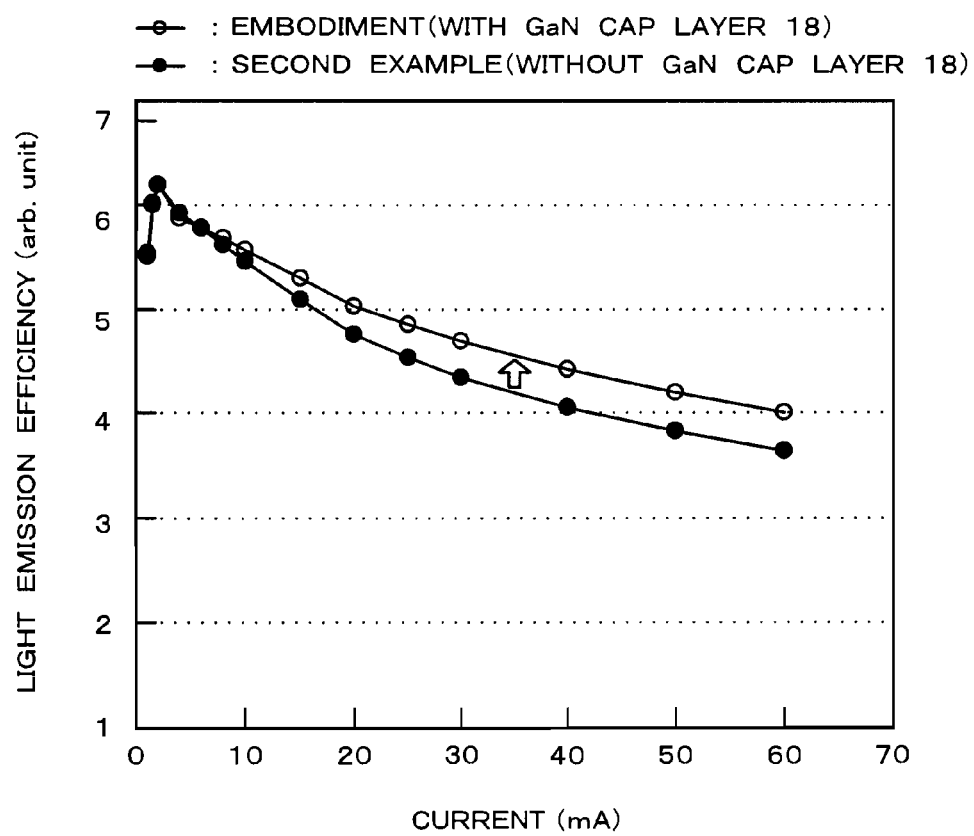
FIG. 5 is a diagram showing the light emission efficiency of the nitride semiconductor light emitting device in comparison with a light emission efficiency of a second comparative example.
Figure 6:
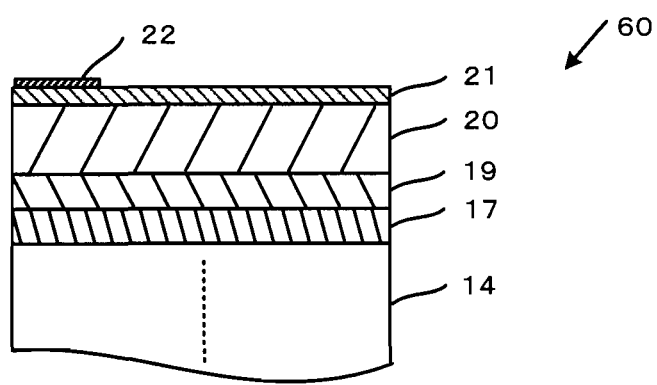
FIG. 6 is a cross-sectional view showing the second comparative example.

FIG. 5 is a diagram showing the dependency of the light emission efficiency of the nitride semiconductor light emitting device 10 on the electric current in comparison with the dependency of the light emission efficiency of a second comparative example on the electric current. FIG. 6 is a cross-sectional view of the second comparative example.

In this respect, the second comparative example was a nitride semiconductor light emitting device 60 which, as shown in FIG. 6, did not include the undoped thin AlGaN cap layer 18 in which the Al composition ratio x1 was low. To begin with, the second comparative example will be explained.

As shown in FIG. 5, the nitride semiconductor light emitting device 60 of the second comparative example exhibited almost the same light emission efficiency as did the nitride semiconductor light emitting device 10 of the embodiment, while the electric current was 10 mA or less. However, the light emission efficiency of the nitride semiconductor light emitting device 60 of the second comparative example decreased rapidly as the electric current increased.

On the other hand, the light emission efficiency of the nitride semiconductor light emitting device 10 of the embodiment decreased slowly as the electric current increased. In addition, higher light emission efficiency was obtained from the nitride semiconductor light emitting device 10 of the embodiment than from the nitride semiconductor light emitting device 60 of the second comparative example.

The rate of the increase in the light emission efficiency was approximately 3% when the electric current was 20 mA, and approximately 6% when the electric current was 50 mA. The rate of the increase tended to increase as the electric current increased.

This suggests that even the thin AlGaN cap layer 18 in which the Al composition ratio x1 was low efficiently inhibited the thermal deterioration of the MQW active layer 14.

Figure 7:
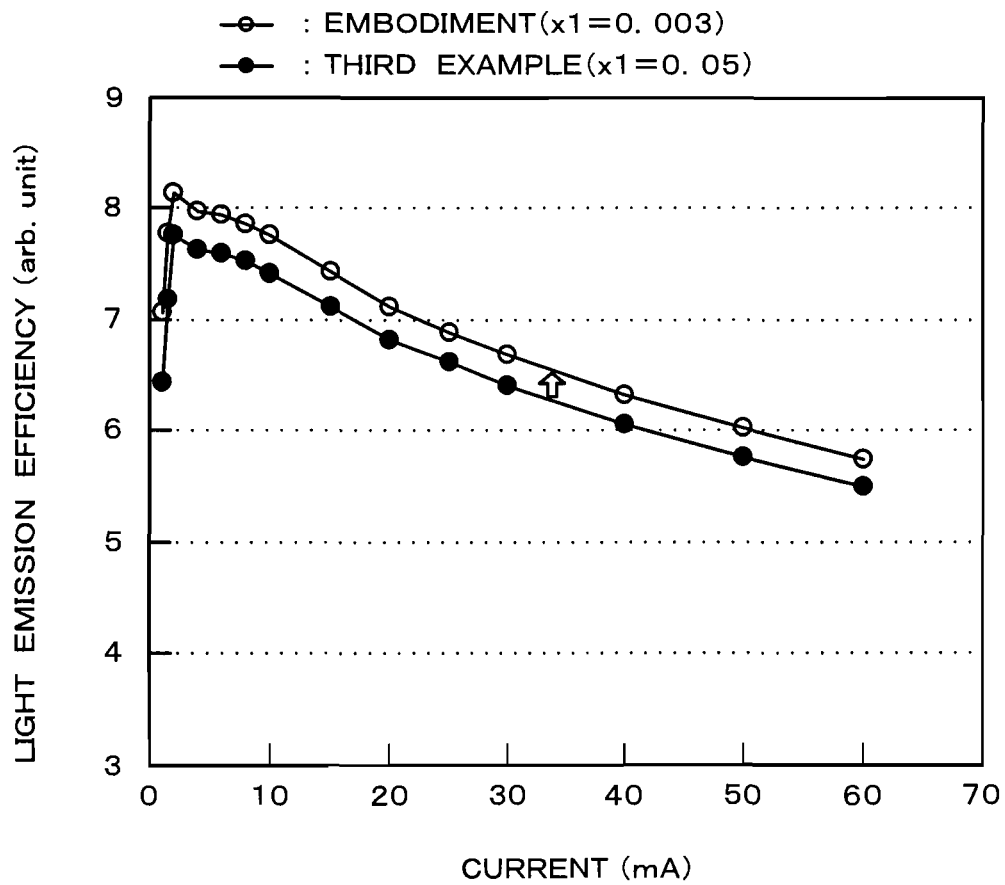
FIG. 7 is a diagram showing the light emission efficiency of the nitride semiconductor light emitting device in comparison with a light emission efficiency of a third comparative example.

FIG. 7 is a diagram showing the dependency of the light emission efficiency of the nitride semiconductor light emitting device 10 on the electric current in comparison with the dependency of the light emission efficiency of a third comparative example on the electric current. In this respect, the third comparative example was a nitride semiconductor light emitting device including an AlGaN cap layer with a higher Al composition ratio x1.

FIG. 7 is the diagram showing the dependency of the light emission efficiency of each of: the nitride semiconductor light emitting device 10 of the embodiment where the Al composition ratio x1 in the AlGaN cap layer 18 was 0.003; and the nitride semiconductor light emitting device of the third comparative example where the Al composition ratio x1 in the AlGaN cap layer was 0.05.

As shown in FIG. 7, the dependency of the light emission efficiency on the electric current was almost the same between the nitride semiconductor light emitting device 10 of the embodiment and the nitride semiconductor light emitting device of the third comparative example. However, higher light emission efficiency was obtained from the nitride semiconductor light emitting device 10 of the embodiment than from the nitride semiconductor light emitting device of the third comparative example in the full range of the electric current.

The rate of the increase in the light emission efficiency was approximately 3% when the electric current was 20 mA, and approximately 2.2% when the electric current was 50 mA. The rate of the increase in the light emission efficiency per unit increase in the electric current tended to be almost constant.

This suggests that because the crystallinity of the AlGaN layer increased as the Al composition ratio became lower, the effect of inhibiting the diffusion of Mg into the MQW active layer 14 was better in the AlGaN cap layer 18 than in the AlGaN cap layer of the third comparative example.

From this, it was confirmed that the optimizing of the two-layered structure including the GaN cap layer 17 and the AlGaN cap layer 18 created the synergism between the effect of inhibiting the thermal deterioration of the MQW active layer 14 and the effect of preventing the diffusion of Mg into the MQW active layer 14.

Next, a method for manufacturing the nitride semiconductor light emitting device 10 will be explained with reference to FIGS. 8 to 11. FIGS. 8 to 11 are cross-sectional views showing the manufacturing steps for the nitride semiconductor light emitting device 10 in the sequential order.

First of all, as a preliminary treatment, a substrate 11, for example, a C-plane sapphire substrate is subjected to organic cleaning and acid cleaning, for example. Thereafter, the resultant substrate 11 is contained in a reaction chamber of the MOCVD system. Subsequently, the temperature Ts of the substrate 11 is raised to T0, for example, 1100° C. by high-frequency heating in a normal-pressure atmosphere of a mixed gas of a nitrogen ($N_2$) gas and a hydrogen ($H_2$) gas. Thereby, the surface of the substrate 11 is etched in gas phase, and a natural oxide film formed on the surface of the substrate 11 is removed.

Figure 8:
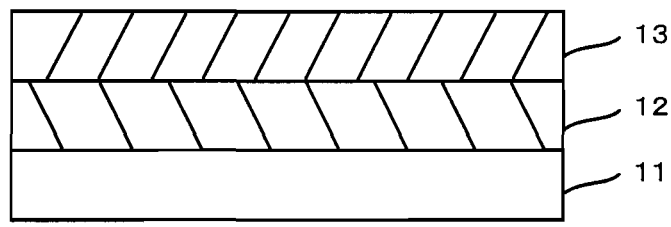
FIGS. 8 to 11 are cross-sectional views showing the steps of manufacturing the nitride semiconductor light emitting device in the sequential order.

Afterward, as shown in FIG. 8, the undoped GaN layer 12 with a thickness of 3 μm is formed by using the mixed gas of the $N_2$ gas and the $H_2$ gas as a carrier gas while supplying an ammonium ($NH_3$) gas and trimethyl gallium (TMG), for example, as process gases.

Subsequently, the n-type GaN clad layer 13 with a thickness of 2 μm is formed while supplying a silane ($SiH_4$) gas, for example, as the n-type dopant.

Thereafter, the temperature Ts of the substrate 11 is decreased to and kept at T1, for example, 800° C. which is lower than T0, while continuing supplying the $NH_3$ gas with the supply of TMG and the $SiH_4$ gas stopped.

Figure 9:
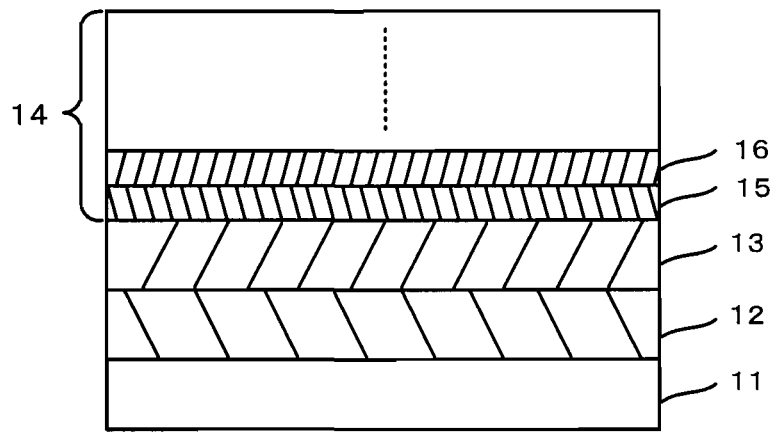

Afterward, as shown in FIG. 9, the GaN barrier layer 15 with a thickness of 5 nm is formed by using the $N_2$ gas as the carrier gas while supplying the $NH_3$ gas and TMG, for example, as the process gases. After that, the InGaN well layer 16 with a thickness of 2.5 nm, in which the In composition ratio is 0.1, is formed by supplying trimethyl indium (TMI) as another process gas.

Subsequently, the forming of the GaN barrier layer 15 and the forming of the InGaN well layer 16 are alternately repeated 7 times, for example, while intermittently supplying TMI. Thereby, the MQW active layer 14 is obtained.

Figure 10:
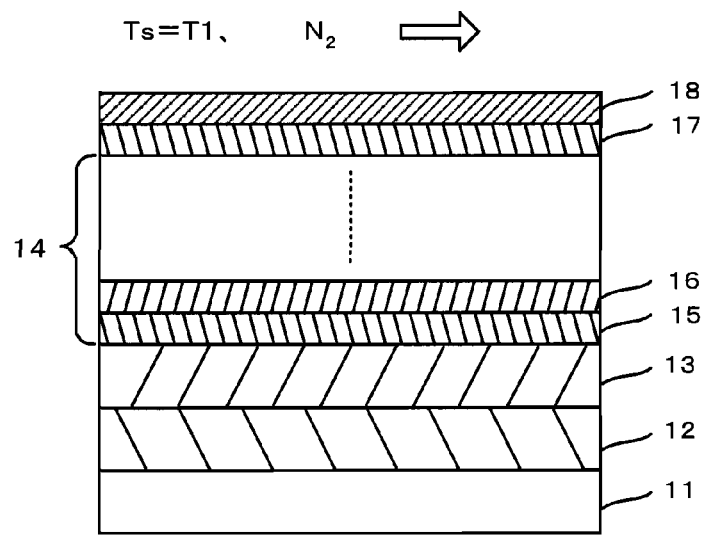

Thereafter, as shown in FIG. 10, the undoped GaN cap layer 17 with a thickness of 5 nm is formed while continuing supplying TMG and the $NH_3$ gas with the supply of TMI stopped.

Afterward, the undoped AlGaN cap layer 18 with a thickness of 1 nm, in which the Al composition ratio is 0.003, is formed while supplying trimethyl aluminum (TMA) with the supply of TMG continuing.

After that, the temperature Ts of the substrate 11 is raised to and kept at T2, for example, 1030° C. which is higher than Ti, in the $N_2$ gas atmosphere while continuing supplying the $NH_3$ gas with the supply of TMA stopped.

Figure 11:
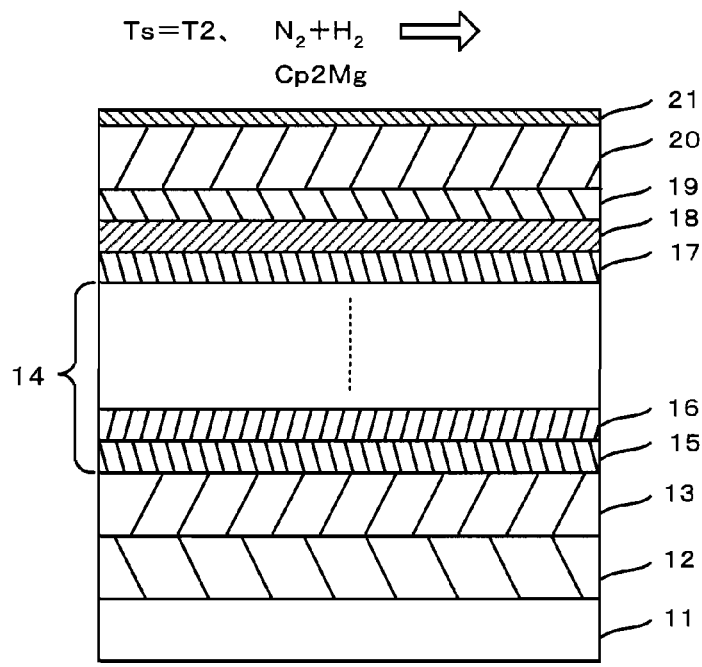

Subsequently, as shown in FIG. 11, the p-type AlGaN electron barrier layer 19 with a thickness of 10 nm, in which the concentration of Mg is 1E19 to 20 $cm^{-3}$, is formed by using the mixed gas of the $N_2$ gas and the $H_2$ gas as the carrier gas while supplying: the $NH_3$ gas, TMG and TMA as the process gases; and bis(cyclopentadienyl) magnesium (Cp2Mg) as the p-type dopant.

Thereafter, the p-type GaN clad layer 20 with a thickness of approximately 100 nm, in which the concentration of Mg is 1E20 $cm^{-3}$, is formed while continuing supplying TMG and Cp2Mg with the supply of TMA stopped.

Thereafter, the p-type GaN contact layer 21 with a thickness of approximately 10 nm, in which the concentration of Mg is 1E21 $cm^{-3}$, is formed while supplying an increased amount of Cp2Mg.

Afterward, the temperature Ts of the substrate 11 is lowered naturally with the supply of only the carrier gas continued while continuing supplying the $NH_3$ gas with the supply of TMG stopped. The supplying of the $NH_3$ gas is continued until the temperature Ts of the substrate 11 reaches 500° C.

After that, the resultant substrate 11 is taken out of the MOCVD system. Subsequently, a portion of the resultant substrate 11 is removed by RIE (reactive ion etching) until the removed portion reaches the n-type GaN clad layer 13. Thereafter, the n-side electrode 23 made of Ti/Pt/Au is formed on the exposed portion of the n-type GaN clad layer 13.

Furthermore, the p-side electrode 22 made of Ni/Au is formed on the p-type GaN contact layer 21. The nitride semiconductor light emitting device 10 shown in FIG. 1 is obtained through these steps.

The measurement of the I-V (current-voltage) characteristic of the nitride semiconductor light emitting device 10 shows that the operation voltage is 3.1 to 3.5V when the electric current is 20 mA. On this occasion, approximately 15 mW is obtained as the light output. The peak wavelength of the light emission is approximately 450 nm.

In the embodiment, as described above, the undoped thick GaN cap layer 17 and the undoped thin AlGaN cap layer 18, in which the Al composition ratio x1 is low, are formed at the temperature which is equal to the temperature T1 for forming the MQW active layer 14.

As a result, the thermal deterioration of the MQW active layer 14 is prevented while the temperature is raised from the temperature T1 to the temperature T2. In addition, the diffusion of Mg into the MQW active layer 14 can be prevented while the p-type AlGaN electron barrier layer 19 and the p-type GaN contact layer 21 are formed at the temperature T2.

Thereby, the quality of the MQW active layer 14 is maintained. This makes it possible to obtain: the nitride semiconductor light emitting device capable of offering the sufficient light output; and the method for manufacturing the same.

The film thickness of the GaN cap layer 17 as well as the Al composition ratio x1 and the film thickness of the AlGaN cap layer 18, which are mentioned in the foregoing descriptions of the embodiment, are shown as the examples. It is more desirable that the film thickness of the GaN cap layer 17 as well as the Al composition ratio x1 and the film thickness of the AlGaN cap layer 18 should be optimized depending on the structure of the nitride semiconductor light emitting device, the manufacturing conditions for the nitride semiconductor light emitting device, and the like within the scope not departing from the gist which has been described above.

The foregoing descriptions have been provided for the case where the C-plane sapphire substrate is used as the substrate 11. However, another substrate, for example, a GaN substrate, a SiC substrate, a ZnO substrate or something similar may be used as the substrate 11.

Furthermore, the plane orientation of the substrate 11 is not limited to the C-plane. Another plane, for example, a nonpolar plane may be used.

The foregoing descriptions have been provided for the case where MOCVD is used as the film-forming technique for a nitride semiconductor layer. However, another film-forming technique, for example, hydride vapor phase epitaxy (HVPE), molecular beam epitaxy (MBE), or something similar may be used.

The foregoing descriptions have been provided for the case where TMG, TMA, TMI, $NH_3$ are used as the process gases. However, another process gas, for example, triethyl gallium (TEG) may be used.

What is claimed is:

1. A method for manufacturing a nitride semiconductor light emitting device, comprising:
    forming an active layer including an In-containing nitride semiconductor on a first layer including an n-type nitride semiconductor;
    forming a GaN layer and a first AlGaN layer having a first Al composition ratio on the active layer in order by metal organic chemical vapor deposition at a first growth temperature in a nitrogen gas atmosphere without doping with Mg;
    forming a second AlGaN layer on the first AlGaN layer by metal organic chemical vapor deposition at a second growth temperature, in an atmosphere mainly containing a hydrogen gas with doping with Mg, the second AlGaN layer having a second Al composition ratio larger than the first Al composition ratio, and the second growth temperature being higher than the first growth temperature; and
    forming a second layer including a p-type nitride semiconductor on the second AlGaN layer.

2. The method for manufacturing the nitride semiconductor light emitting device according to claim 1, wherein the first Al composition ratio is greater than 0 and not greater than 0.01.

3. The method for manufacturing the nitride semiconductor light emitting device according to claim 1, wherein a concentration of Mg in each of the GaN layer and the first AlGaN layer is not greater than $1E18\ cm^{-3}$.

4. The method for manufacturing the nitride semiconductor light emitting device according to claim 1, wherein the first AlGaN layer has a smaller thickness than the GaN layer.

5. The method for manufacturing the nitride semiconductor light emitting device according to claim 1, wherein a concentration of Mg in the GaN layer is not greater than $1E18\ cm^{-3}$.

6. The method for manufacturing the nitride semiconductor light emitting device according to claim 1, wherein a concentration of Mg in the first AlGaN layer is not greater than $1E18\ cm^{-3}$.

7. The method for manufacturing the nitride semiconductor light emitting device according to claim 1, wherein a concentration of Mg in the GaN layer is not greater than $1E18\ cm^{-3}$, the first AlGaN layer is formed on the GaN layer, the first Al composition ratio is greater than 0 and not greater than 0.01, a concentration of Mg in the first AlGaN layer is not greater than $1E18\ cm^{-3}$ and the first AlGaN layer has a smaller thickness than the GaN layer.

\* \* \* \* \*